US010271462B1

(12) United States Patent
Ross et al.

(10) Patent No.: US 10,271,462 B1
(45) Date of Patent: Apr. 23, 2019

(54) RAPID DEPLOY AIR COOLING SYSTEM

(71) Applicant: Amazon Technologies, Inc., Seattle, WA (US)

(72) Inventors: Peter George Ross, Olympia, WA (US); Robert David Wilding, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 47 days.

(21) Appl. No.: 14/938,652

(22) Filed: Nov. 11, 2015

(51) Int. Cl.
| H05K 7/20 | (2006.01) |
| G05B 15/02 | (2006.01) |
| G05D 7/06 | (2006.01) |
| F24F 11/00 | (2018.01) |
| F24F 11/30 | (2018.01) |

(52) U.S. Cl.
CPC ...... *H05K 7/20745* (2013.01); *F24F 11/0001* (2013.01); *G05B 15/02* (2013.01); *G05D 7/0629* (2013.01); *H05K 7/20827* (2013.01); *F24F 2011/0002* (2013.01)

(58) Field of Classification Search
CPC ........... H05K 7/20745; H05K 7/20827; H05K 7/20836; H05K 7/1497; H05K 7/1488; G06F 1/20; G06F 1/206; G06F 1/181
USPC .............. 361/679.47, 679.49, 696, 701, 724; 62/96; 312/223.2; 454/184
See application file for complete search history.

(56) References Cited

U.S. PATENT DOCUMENTS

| 6,034,873 | A * | 3/2000 | Stanghl | H05K 7/20745 165/80.3 |
| 7,944,692 | B2 * | 5/2011 | Grantham | H05K 7/20745 361/688 |
| 8,943,757 | B2 * | 2/2015 | Parizeau | E04H 1/005 361/694 |
| 8,964,373 | B2 * | 2/2015 | Rembach | F28D 15/0275 361/679.47 |
| 2010/0315775 | A1 * | 12/2010 | Grantham | H05K 7/20745 361/688 |
| 2013/0201618 | A1 * | 8/2013 | Czamara | H05K 7/1497 361/679.5 |
| 2014/0083661 | A1 * | 3/2014 | Leckelt | F24F 11/0001 165/163 |
| 2015/0208553 | A1 * | 7/2015 | Bauchot | H05K 7/20745 361/679.47 |

(Continued)

OTHER PUBLICATIONS https://www.merriam-webster.com/dictionary/rail.*
"The Wall-Mount(tm) Air Conditioners (50HZ)", Bard Climate Control Solutions, Jul. 2010, pp. 1-8.

*Primary Examiner* — Mandeep S Buttar
(74) *Attorney, Agent, or Firm* — Robert C. Kowert; Meyertons, Hood, Kivlin, Kowert & Goetzel, P.C.

(57) ABSTRACT

A data center includes rack mounted computing systems arranged in rows with one or more cold aisles between success rows of rack mounted computing systems. A modular cooling unit is configured to mount above one of the cold aisles and form a ceiling for the cold aisle and partially seal the cold aisle from other environments in the data center. The modular cooling unit draws air from the other environments, cools the air, and directs the cooled air into the cold aisle. Modular cooling units may be incrementally added to a data center as additional rows of rack computing systems are added to the data center.

17 Claims, 9 Drawing Sheets

(56) References Cited

U.S. PATENT DOCUMENTS

| | | | |
|---|---|---|---|
| 2015/0305208 A1* | 10/2015 | Rogers | H05K 7/20745 165/80.3 |
| 2015/0338281 A1* | 11/2015 | Ross | G01K 3/14 236/44 A |
| 2016/0087435 A1* | 3/2016 | Ortner | H02J 9/066 307/23 |
| 2016/0192542 A1* | 6/2016 | LeFebvre | H05K 7/20836 361/679.47 |

* cited by examiner

RAPID DEPLOY AIR COOLING SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data centers rely on forced air systems and air conditioning systems to maintain the temperatures and other environmental conditions in their data centers within acceptable limits. The initial and ongoing costs of installing and operating these systems may add substantial cost and complexity to data center operations.

The amount of computing capacity needed for any given data center may change rapidly as business needs dictate. Most often, there is a need for increased computing capacity at a location. Many data centers may require significant changes to HVAC systems in order to accommodate additional computing capacity to be installed at a data center location. Other data centers may include HVAC capacity capable of supporting a fully utilized data center even though initially only a portion of the data center may be utilized. Thus capital and operating costs may be tied up in providing and supporting HVAC capacity that is not necessary to support current data center operations. Re-configuring existing HVAC capacity to accommodate additional computing capacity at a data center location or oversupplying HVAC capacity may add substantial costs to data center operations.

Figure 1:
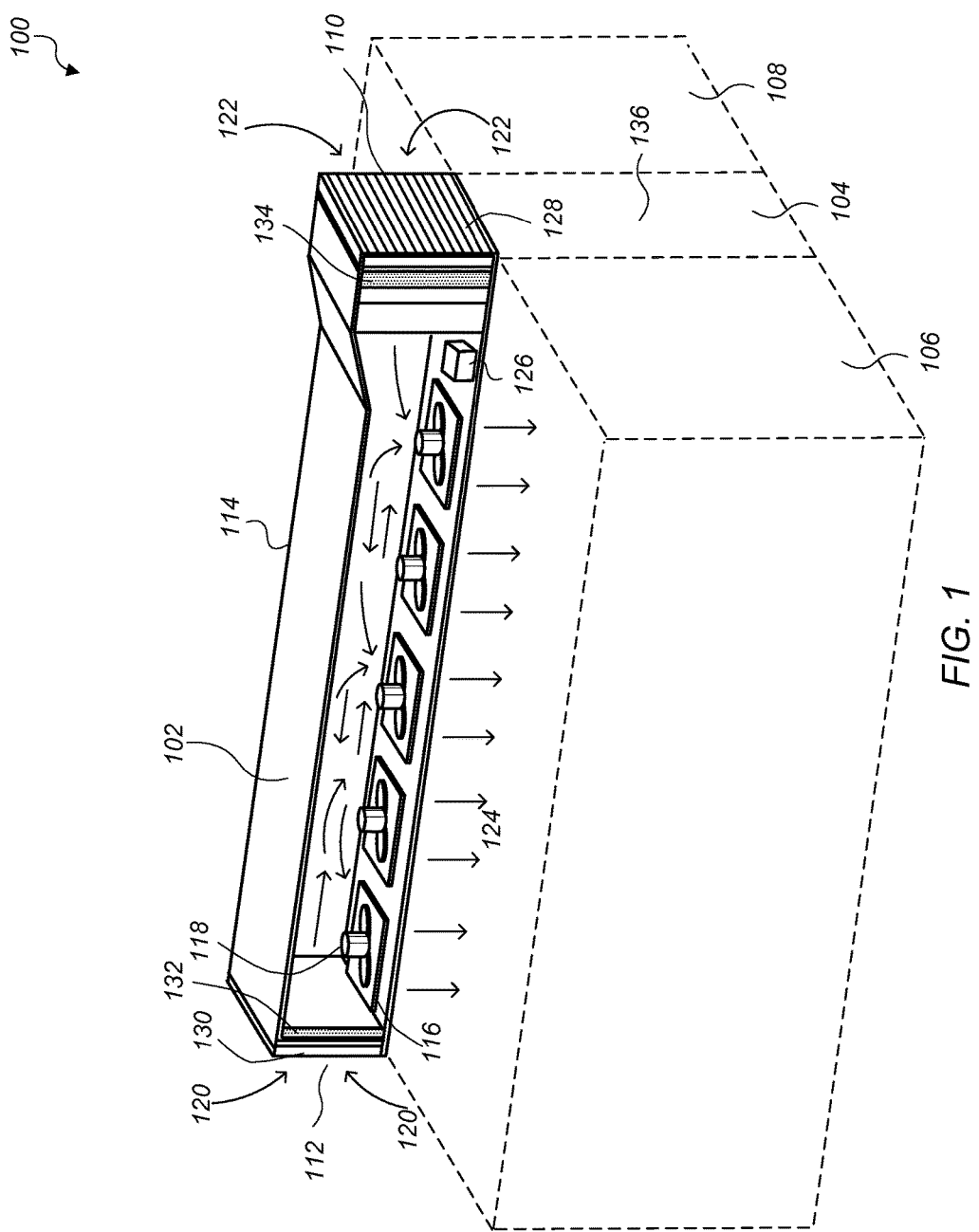
FIG. 1 illustrates a cutaway view of an interior of a modular cooling unit mounted above a cold aisle, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for providing cooling resources are disclosed. According to one embodiment, a data center includes multiple rack computing systems that include multiple computing devices mounted in multiple racks. The rack computing systems are arranged in rows with one or more cold aisles between successive rows of the rack computing systems. For example, rack computing systems may be arranged so that cooling air is drawn into the rack computing systems from a cold aisle and heated air that has cooled heat producing components in the rack computing systems is directed into a hot aisle. The data center also includes multiple modular cooling units mounted in the data center such that respective bottom surfaces of respective ones of the modular cooling units form respective ceilings for respective cold aisles. Each modular cooling unit includes one or more air inlets, a plenum formed by a body of the modular cooling unit, one or more outlet vents in a bottom surface of the plenum and a set of one or more air moving devices. The modular cooling units at least partially seal the respective cold aisles from one or more other environments. For example, the modular cooling units may seal the cold aisles from an interior portion of the data center that is separate from the cold aisles, such as a hot aisle or non-cooled portion of the data center. Respective sets of air moving devices of the modular cooling units are configured to draw air into the respective plenums of the respective modular cooling units from the one or more other environments and are configured to direct air from the respective plenums of the respective modular cooling units through the respective outlet vents into the respective cold aisles.

According to one embodiment, an apparatus includes one or more air inlets; a plenum formed by a body of the apparatus; and one or more air moving devices. The apparatus is configured to mount in a data center such that the body of the apparatus at least partially seals a cold aisle in the data center from one or more other environments, and the one or more air moving devices in the apparatus are configured to draw air into the plenum of the apparatus via the one or more air inlets from the one or more other environments and direct air from the plenum of the apparatus through one or more outlet vents in the plenum into the cold aisle.

According to one embodiment, a method includes positioning a modular cooling unit above a plurality of rack computing systems in a data center arranged in two successive rows with a cold aisle between the two successive rows such that a bottom surface of the modular cooling unit at least partially seals the cold aisle from one or more other environments and operating the modular cooling unit to cool the cold aisle.

As used herein, an "aisle" means a space next to one or more racks.

As used herein, "air moving device" includes any device, element, system, or combination thereof that can move air. Examples of air moving devices include fans and blowers.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "evaporative cooling" means cooling of air by evaporation of a liquid.

As used herein, a "free cooling" includes a mode of operation in which an air handling system pulls air at least partially from an external source (such as air outside a facility) and forces the air to pass through electronic equipment without active chilling in the air-handling system (e.g., fluid flow through chiller coils in the air handling system is shut off by closing a flow control valve or liquid is not supplied to an evaporative cooler in the air handling system).

As used herein, a "hot aisle" means an aisle into which heated air can be discharged for use in removing heat from a system, such as a rack computing system.

As used herein, "rack computing systems" means a computing system that includes one or more computing devices mounted in a rack.

As used herein, "room" means a room or a space of a building. As used herein, "computer room" means a room of a building in which computing devices, such as rack-mounted servers, are operated.

As used herein, a "space" means a space, area or volume.

In some embodiments, a data center includes multiple modular cooling units that each provide cooling to respective cold aisles of the data center. A cold aisle in a data center may be formed by a space between two successive rows of rack computing systems. The rack computing systems may be arranged such that the rack computing systems draw cooling air into the rack computing systems from the cold aisle and expel heated air into a non-cold aisle portion of the data center. A modular cooling unit may be mounted above a cold aisle and form a ceiling for the cold aisle such that the cold aisle is at least partially sealed from one or more other environments in a data center, such as hot aisles or a hot portion of the data center. Each modular cooling unit may provide cooling for a particular cold aisle above which it is mounted. Also, additional modular cooling units may be installed in the data center as successive rows of computing systems are added to the data center or as successive rows of computing systems in the data center are put into operation. For example, as computing demand increases for computing services implemented on rack computing systems in a data center, additional racks of computing systems may be added to the data center. The added rack computing systems may be added in rows with cold aisles between successive rows. Modular cooling units may be incrementally added to the data center to provide cooling to additional cold aisles. In this way, modular cooling units allow cooling to be provided to cold aisles incrementally as cold aisles are added to a data center without unnecessarily cooling unused space in a data center.

Modular cooling units may seal a cold aisle from an ambient environment within a data center, so that cooling provided by the modular cooling units cool the cold aisles without cooling other portions of the data center that do not need to be cooled. For example, a data center may be partially filled with rack computing systems. Modular cooling units may seal cold aisles between the rack computing systems and provide cooling to the cold aisles without cooling a portion of the data center that is not yet filled with rack computing systems. In some embodiments, the interior space in a data center may be considered a hot area or a large hot aisle and a modular cooling unit along with one or more other partitions may seal a cold aisle from the hot interior space of the data center.

FIG. 1 illustrates a cutaway view of an interior of a modular cooling unit mounted above a cold aisle, according to some embodiments. A modular cooling unit, such as modular cooling unit 102, may be mounted in a data center, such as data center 100, such that the modular cooling unit forms a ceiling for a cold aisle between successive rows of rack computing systems. For example, modular cooling unit 102 forms a ceiling for cold aisle 104 between row 106 of rack computing systems and row 108 of rack computing systems. A row of rack computing systems may include any number of standard 19" racks with rack mounted electronic equipment, such as computing systems, networks equipment, power equipment, etc. mounted within the racks. In some embodiments, rows 106 and 108 of rack computing systems may include electronic equipment mounted in non-standard racks. A modular cooling unit may at least partially seal a cold aisle from one or more other environments. For example, modular cooling unit 102 may seal the upper surface (e.g. ceiling) of cold aisle 104 from an ambient environment within data center 100. Other partitions, such as door 136, may also at least partially seal a cold aisle, such as cold aisle 104, from one or more other environments.

A modular cooling unit may include one or more air inlets, a plenum formed by a body of the modular cooling unit, one or more outlet vents in a bottom surface of the plenum, and a set of air moving devices. For example, modular cooling unit 102 includes fresh air inlet 110 and recycled air inlet 112 at either end of body 114 that forms a plenum between fresh air inlet 110 and recycled air inlet 112. Vents 116 are located in a bottom surface of modular cooling unit 102 along the plenum formed by body 114 between fresh air inlet 110 and recycled air inlet 112. Air moving devices 118 are mounted in modular cooling unit 102 above respective ones of vents 116. Air moving devices 118 draw recycled air 120 and fresh air 122 into modular cooling unit 102 and direct mixed air 124 that includes recycled air 120 and fresh air 122 into cold aisle 104.

A modular cooling unit, such as modular cooling unit 102, may operate in various modes, such as a free cooling mode, an evaporative cooling mode, a closed loop cooling mode, etc. A modular cooling unit may include a controller, such as controller 126 included in modular cooling unit 102. A controller may control one or more control devices included in a modular cooling unit in order to control one or more conditions of mixed air directed from the modular cooling unit into an associated cold aisle. In some embodiments, a modular cooling unit includes flow control devices mounted at one or more air inlets of the modular cooling unit. For example, modular cooling unit 102 includes flow control device 128 mounted at fresh air inlet 110 and configured to regulate a flow of fresh air into modular cooling unit 102 via fresh air inlet 110. Modular cooling unit 102 also includes flow control device 130 mounted at recycled air inlet 112 and configured to regulate a flow of recycled air from within data center 100 into modular cooling unit 102 via recycled air inlet 112. In some embodiments, air moving devices in a modular cooling unit, such as air moving devices 118 may be variable speed devices, and a controller, such as controller 126, may adjust one or more speeds of the air moving devices in the modular cooling unit in addition to adjusting the flow control devices at the inlets of the modular cooling unit. For example, controller 126 may adjust one or more speeds of air moving devices 118 to cause more or less air to be drawn into modular cooling unit 102 and flow control devices 128 and 130 may adjust flows through fresh air inlet 110 and recycled air inlet 112 to alter a distribution of air that is drawn into modular cooling unit 102 from within data center 100 via recycled air inlet 112 and that is brought into modular cooling unit 102 from an external environment outside of data center 100 via fresh air inlet 110.

In some embodiments, flow control devices, such as flow control devices 128 and 130 may include adjustable dampers, an adjustable opening, or other well-known methods of regulating air flow.

In some operation modes, a mixed air flow directed into a cold aisle from a modular cooling unit may include different proportions of recycled air and fresh air. As discussed in more detail below in regard to FIGS. 3 and 4, in some embodiments a modular cooling unit may include an evaporative cooler and/or cooling coils that circulate a cooling fluid. A controller, such as controller 126, may command flow control devices to adjust flows through the evaporative cooler, cooling coils, etc. in order to control conditions of mixed air being provided to a cold aisle from a modular cooling unit.

For example, ambient conditions external to a data center may be such that ambient air is at a proper temperature and/or humidity to cool computing systems that receive cooling air from a cold aisle supplied cooling air from a modular cooling unit without changing the temperature or humidity of the ambient air. In such conditions, a modular cooling unit may operate in a free-cooling mode, where the majority or all of the air supplied to an associated cold aisle is drawn from an ambient environment external to the data center without additional cooling being applied. For example, in a free-cooling mode, controller 126 of modular cooling unit 102 may command flow control device 130 to close so that air is not drawn into modular cooling unit 102 via recycled air inlet 112 and may command fresh air inlet 110 to fully open so that the majority of the air drawn into modular cooling unit 102 is drawn into modular cooling unit via fresh air inlet 110.

In another example, ambient conditions external to a data center may be such that it is undesirable to use ambient air to cool rack computing systems that receive cooling air from a cold aisle associated with a particular modular cooling unit. For example, a location of a data center may be experiencing a dust storm, and it may be undesirable to draw possibly contaminated ambient air into the data center. In such situations, a controller, such as controller 126, may command a flow control device to shut so that ambient air external to the data center is not drawn into the data center. For example, controller 126 may command flow control device 128 at fresh air inlet 110 to fully close and may command flow control device 130 at recycled air inlet 112 to fully open.

In some embodiments, a modular cooling unit may include one or more filter elements to filter air passing through a modular cooling unit. For example, modular cooling unit 102 includes filter element 132 at recycled air inlet 112 and filter element 134 at fresh air inlet 110.

In some embodiments, a controller of a modular cooling unit, such as controller 126, may command flow control devices, such as flow control devices 128 and 130 to adjust respective flows of recycled air and fresh air such that mixed air directed from the modular cooling unit meets one or more control conditions. For example control conditions may include a set point temperature of air supplied to a cold aisle, a set point temperature of rack computing systems cooled by a cold aisle receiving cooling air from the modular cooling unit, humidity of mixed air directed from a modular cooling unit to a cold aisle, or one or more other control conditions that describe set point characteristics of air being supplied to a cold aisle from a modular cooling unit.

In certain embodiments, a controller includes at least one programmable logic controller. The PLC may, among other things, regulate air moving devices and open and close valves or dampers in a modular cooling unit based upon command signals from a building management system to channel air flow through a cold aisle as necessary for the prevailing operational conditions. Alternatively, the PLC may regulate air moving devices and open and close valves or dampers in a modular cooling unit autonomously without input from an outside control system.

A control system including a controller may include temperature measurement devices that are, in one embodiment, thermocouples. Alternatively, the temperature measurement devices may include, but are not limited to, resistance temperature detectors (RTDs) and any device that facilitates cooling operation as described herein. For example, a thermocouple may be positioned within a plenum of a modular cooling unit to facilitate measuring a temperature of the air in the plenum.

In some embodiments, a data center with a cold aisle cooled by a modular cooling unit may comprise as few as two rows of rack mounted computing systems, such as shown in FIG. 1. In some embodiments, a data center may include multiple cold aisles each with respective modular cooling units that provide cooling air to the respective multiple cold aisles.

In some embodiments, a controller, such as controller 126 may adjust amounts of recycled air and fresh air that are included in mixed air directed into a cold aisle. In embodiments that include an evaporate cooler at a fresh air inlet, by adjusting a proportion of air drawn from the fresh air inlet, a controller may adjust an amount of air that is cooled by the evaporative cooler. In embodiments that include cooling coils at a recycled air inlet, a controller may adjust an amount of air that is cooled by the cooling coils by adjusting an amount of air that is drawn into the modular cooling unit from the recycled air inlet. In addition to adjusting air distributions between inlets, a controller may adjust an overall volume of air that is drawn into a modular cooling unit by increasing or decreasing one or more speeds of one or more air moving devices in a modular cooling unit. In some embodiments, a controller may adjust a flow rate of a cooling fluid flowing thorough cooling coils included in a modular cooling unit to control conditions of mixed air being supplied to an associated cold aisle. In some embodiments, a controller may adjust an amount of liquid supplied to an evaporative cooler. In some embodiments, a controller may be configured to adjust flow control devices, control valves, air moving device speeds, etc. to provide required cooling to a cold aisle while minimizing an overall amount of energy used to provide the cooling to the cold aisle.

Figure 2:
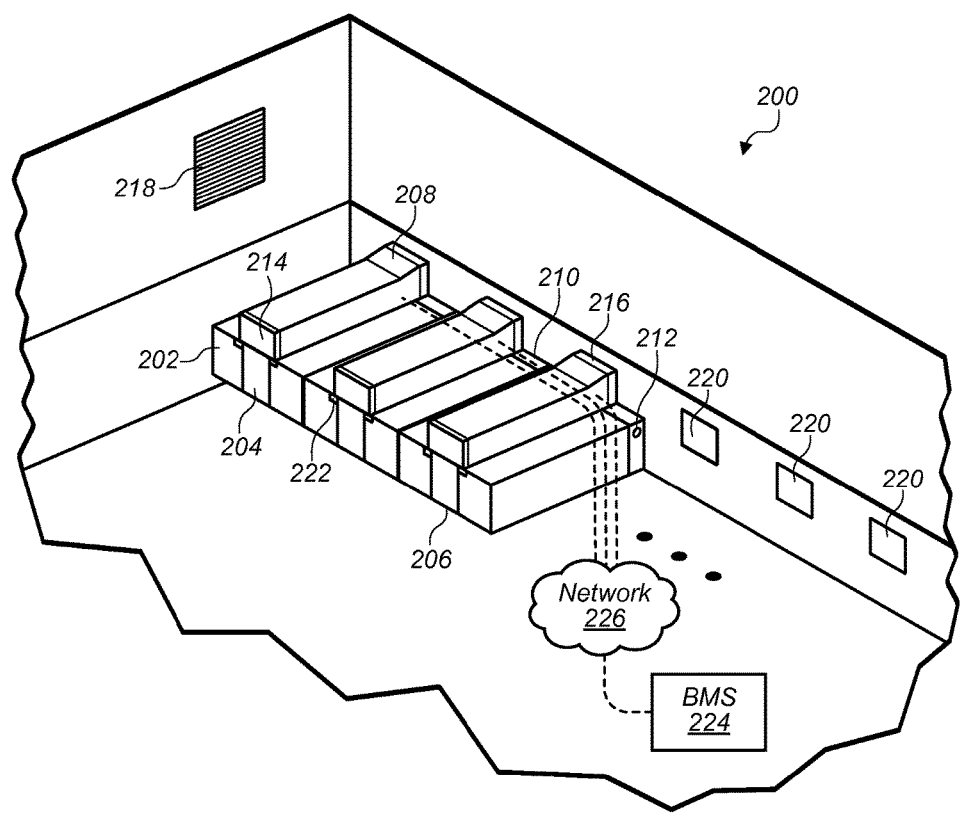
FIG. 2 illustrates a cut-away of a data center with modular cooling units mounted above respective cold aisles, according to some embodiments.

FIG. 2 illustrates a cut-away of a data center with modular cooling units mounted above respective cold aisles, according to some embodiments. Data center 200 includes rack computing systems 202 with cold aisles 204 between successive rows of rack computing systems 202. Partitions 206 along with modular cooling units 208 at least partially seal cold aisles 204 from an ambient environment within data center 200. Cold aisles 204 are connected via a passageway 210. Door 212 allows access to passageway 210 connecting cold aisles 204. In some embodiments, modular cooling units 208 may cool passageway 210. In some embodiments, each cold aisle 204 may include a door that partially seals individual ones of cold aisles 204 from passageway 210. Rack computing systems 202 may draw cooling air into the rack computing systems from respective cold aisles 204 and expel heated air into the ambient environment of data center 200 that is not sealed in a cold aisle. A modular cooling unit 208 may draw air from the ambient environment within data center 200 into the modular cooling unit through a recycled air inlet, such as recycled air inlets 214. Modular cooling units 208 may be the same as modular cooling unit 102 described in regard to FIG. 1 or any of the modular cooling units described in FIGS. 1-9. A modular cooling unit 208 may also draw air into the modular cooling unit from an external environment external to data center 200. For example, modular cooling units 208 may draw outside air into modular cooling units 208 via fresh air inlets 216 that protrude through one or more walls of data center 200. In some embodiments, a data center, such as data center 200, may include exhaust vents, such as exhaust vents 218. An exhaust vent may allow exhaust air to be exhausted from a non-cold aisle portion of a data center when fresh air is brought into the data center via a fresh air inlet. In some embodiments, natural convection may cause heated air to flow out of an exhaust vent, such as exhaust vent 218. In some embodiments, one or more air moving devices may direct heated air out of an exhaust vent, such as exhaust vent 218.

In some embodiments, a modular cooling unit may be inserted into a data center through an external wall of the data center. A data center may include one or more removable panels that can be removed to create an opening that can accept a modular cooling unit. For example, data center 200 includes removable panels 220. One of removable panels 220 may be removed, and a modular cooling unit, such as one of modular cooling units 208 may be inserted through an opening created by removing the removable panel 220. Rack computing systems may include or be coupled to a structure that includes rail structures mounted above respective portions of the rack computing systems. For example, rack computing systems 202 include rails structures 222 on either side of the hot aisle.

In some embodiments, a data center 200 may not initially be filled with rack computing systems 202 or may be only partially filled with rack computing systems 202. As demand for computing capacity from data center 200 increases, additional rows of rack computing systems 202 may be added to data center 200. Each additional row of rack computing systems may include rail structures 222 on either side of a hot aisle between rows of the rack computing systems 202. The rack computing systems 202 may be added to a data center 200 such that the rack computing systems form a cold aisle that is aligned with a removable panel 220 on an exterior wall of data center 200. In some embodiments, an exterior wall of data center 200 may be configured such that rows of rack computing systems can be translated into data center 200 through additional openings in the exterior wall of data center 200. Once rack computing systems 202 that include rail structures 222 are installed on either side of a cold aisle aligned with a removable panel 220, a modular cooling unit may be installed in data center 200 by translating the modular cooling unit through an opening formed by removing one of removable panels 220 from the exterior wall of the data center and sliding the modular cooling unit along the rails structures 222 above the rack computing systems 202.

Figure 3:
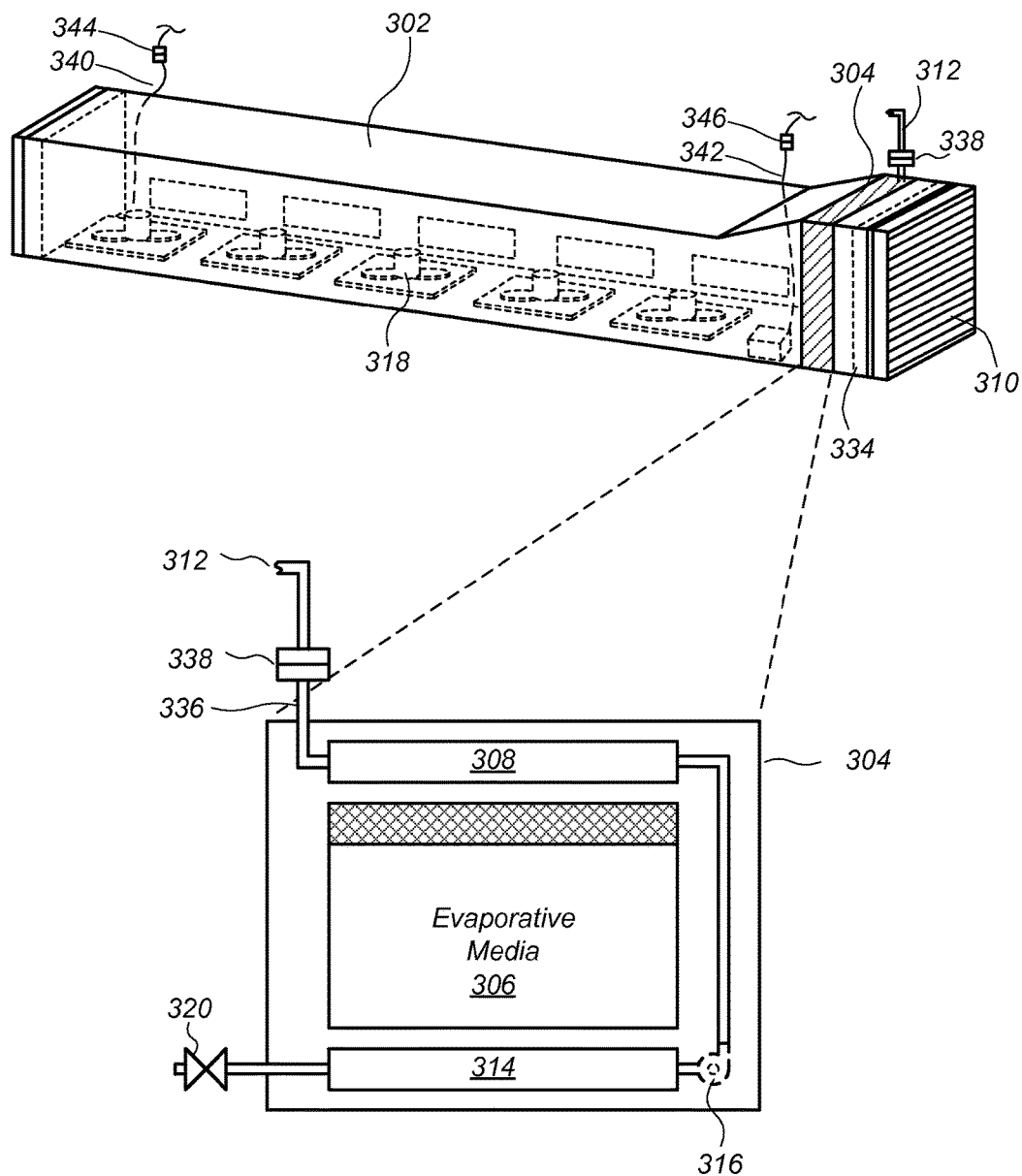
FIG. 3 illustrates a modular cooling unit that includes an evaporative cooler, according to some embodiments.
Figure 4:
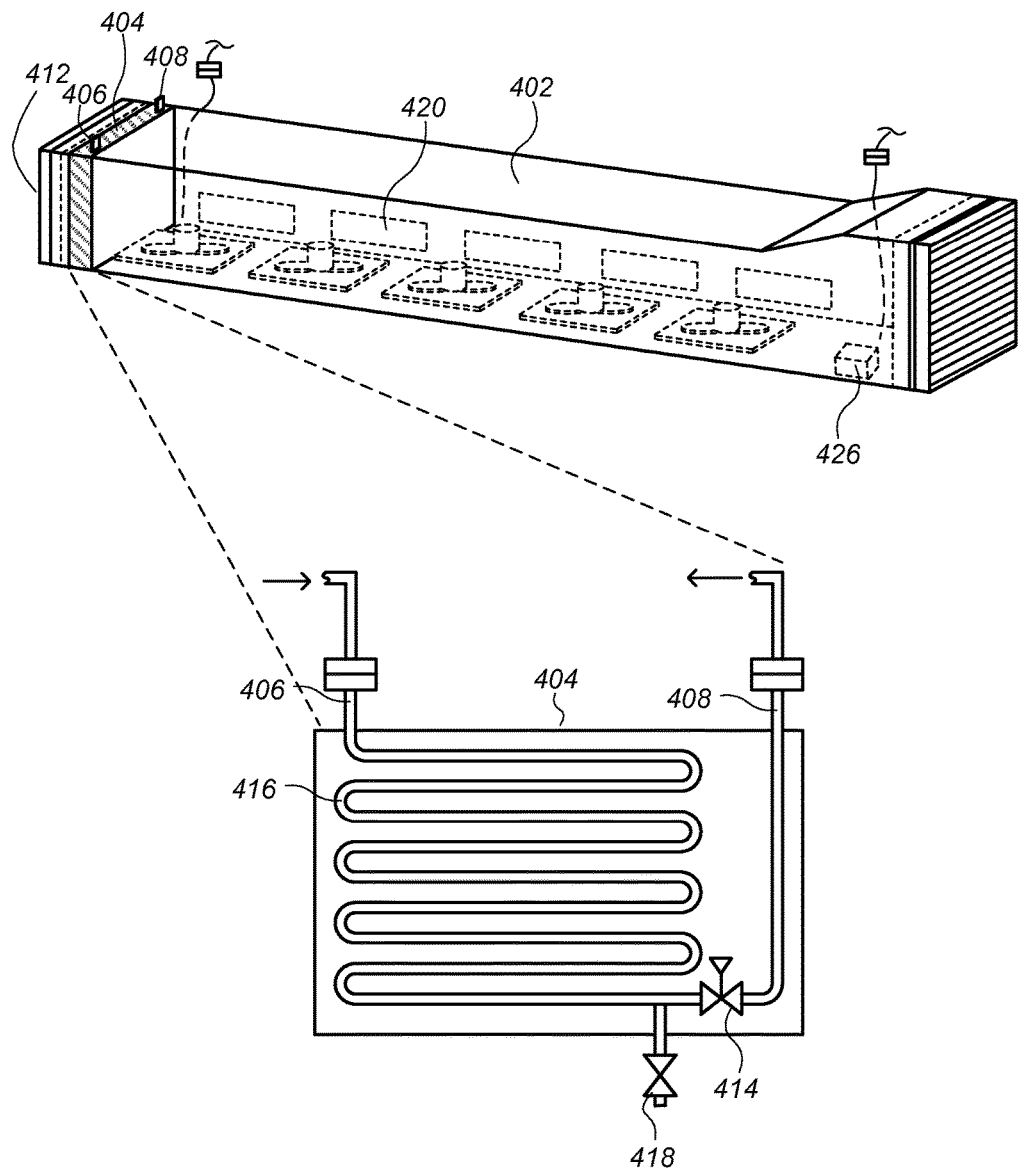
FIG. 4 illustrates a modular cooling unit that includes cooling coils, according to some embodiments.

In some embodiments, a data center, such as data center 200, may include data center support system connectors already installed in the data center prior to the modular cooling unit being installed in the data center. For example, a data center 200 may include data center support connectors that provide a power connection, a water connection, a controller connection, connections to a chilled water system, etc. that are pre-installed in data center 200 before a particular modular cooling unit 208 is installed in data center 200. (Note data support system connectors are not illustrated in FIG. 2 for sake of clarity of the figure, but are illustrated in FIGS. 3 and 4, below.)

In some embodiments, a modular cooling unit, such as one of modular cooling units 208 may be configured and tested at a different location than data center 200. At least some of modular cooling units may be delivered to data center 200 ready to be installed having already been configured and tested offsite. In some embodiments, configuring a modular cooling unit may include installing an evaporative cooler, cooling coils, connectors, etc. in the modular cooling unit.

In some embodiments, a modular cooling unit may be used to convert a non-air conditioned space, such as warehouse, that was built for another purpose into a data center.

In some embodiments, each modular cooling unit may include a controller such as controller 126 described in regard to FIG. 1. In some embodiments, each modular cooling unit 208 may be separately controlled by its respective controller 126. In some embodiments, a building management system, such as BMS 224 may coordinate control of modular cooling units 208 via network 226. A building management system may be implemented on computer systems in a data center or may be implemented in a remote location from the data center. In some embodiments, controller 126 may be implemented remotely from modular cooling units 208 and flow control devices and air moving devices in modular cooling units 208 may be controlled remotely via network 226 and BMS 224. In some embodiments, each of modular control units 208 may be independently controlled via its own controller 126 and BMS 224 may coordinate control between controllers 126. For example, BMS 224 may distribute new set point information to respective controllers 126. In one example, an unsafe condition may be detected in data center 200 and BMS 224 may instruct controllers 126 to enter into a purge mode of operation, where respective flow control devices of the modular cooling units 208 close such that recycled air is not pulled into the modular cooling units, and other flow control devices fully open so that as much outside air as possible is drawn into the modular cooling units.

In some embodiments, a modular cooling unit may operate in an evaporative cooling mode and include an evaporative cooler. FIG. 3 illustrates a modular cooling unit that includes an evaporative cooler, according to some embodiments. Modular cooling unit 302 in FIG. 3 may be the same modular cooling unit 102 described in FIG. 1. Modular cooling unit 302 includes evaporative cooler 304 mounted in a flow of air drawn into modular cooling unit 302 by air moving devices 318 via fresh air inlet 310. As described in FIG. 1, a modular cooling unit may include a filter element 334 so that air drawn into modular cooling unit 302 passes through filter 334 before passing through evaporative cooler 304.

An evaporative cooler may cool air by passing air over an evaporating liquid. As the air passes over the liquid, thermal energy in the air may be drawn out of the air and cause the liquid to change phase from a liquid to a vapor. This is commonly referred to as the latent heat of vaporization of the liquid. By continuously supplying a liquid to be evaporated, a stream of air flowing across the liquid can be cooled. In order to increase the efficiency of the evaporation of the liquid it is desirable to increase the surface area of the liquid that is exposed to the stream of air. For example, evaporative cooler 304 includes evaporative media 306. An evaporative media may be a foam, cloth, fiber, or other type of media that can retain a liquid. Air moving devices in a modular cooling unit, such as air moving devices 318 may cause fresh air to be drawn through fresh air inlet 310 and pass through evaporative cooler 304. As the fresh air passes through evaporative media 306, liquid, such as water retained in evaporate media 306 is converted into vapor. Thermal energy previously in the air is removed from the air and causes the liquid to change phases, thus lowering the temperature of the air passing through the evaporative media.

As liquid is evaporated out of evaporative media 306, additional liquid may be supplied to evaporative media from liquid distribution 308 that receives liquid, such as water, from a data center support system, such as water supply 312.

In some embodiments, an evaporative cooler may include a sump to catch excess liquid that is not evaporated in an evaporative media of the evaporative cooler and a pump to return the excess liquid back to a liquid distribution to be distributed back to the evaporative media. For example, evaporative cooler 304 includes sump 314 and pump 316 to return liquid back to liquid distribution 308. In some embodiments, an evaporative cooler includes a drain valve to drain the evaporative cooler. For example, prior to performing maintenance on the evaporative cooler, the evaporative cooler may be drained. Evaporative cooler 304 includes drain valve 320. In some embodiments, an evaporative cooler may not include a pump and may return excess liquid collected in a sump, such as sump 314, to a return manifold that collects excess liquid from multiple evaporative coolers in multiple modular cooling units. For example, pump 316 is shown in dotted lines to indicate that it is optional. Valve 320 of evaporative cooler 304 may be connected to a return manifold and evaporative cooler 304 may not include pump 316.

In some embodiments, a modular cooling may include one or more flexible connectors. Flexible connectors may include hoses for connecting an evaporative cooler to a data center water supply line, cords for electrically connecting a modular cooling unit to a data center power source, and one or more cables for connecting a controller included in a modular cooling unit to a network, such as network 226 described in FIG. 2. For example, evaporative cooler 304 includes hose 336 and coupler 338 that is configured to couple with water supply 312. In some embodiments, a water supply, such as water supply 312 may be pre-installed in a data center before a modular cooling unit, such as modular cooling unit 302 is installed in the data center. Modular cooling unit 302 also includes power cord 340 configured to couple to data center power 344 and includes network cable 342 configured to couple with data center network connection 346. In some embodiments, power cords and data center network connection cords may be pre-installed in a data center before a modular cooling unit, such as modular cooling unit 302 is installed in the data center.

FIG. 4 illustrates a modular cooling unit that includes cooling coils, according to some embodiments. In some embodiments, a modular cooling unit may include cooling coils that cool a flow of air drawn into a modular cooling unit from a recycled air inlet of the modular cooling unit. For example, modular cooling unit 402 includes cooling coils 404 near recycled air inlet 412 of modular cooling unit 402. Cooling coils may connect to a chilled water system of a data center and circulate chilled water through the cooling coils. Air drawn into a modular cooling unit from a recycled air inlet by air moving devices of the modular cooling unit may pass over the cooling coils. Heat energy from the recycled air passing over the cooling cools may be transferred to the cooling fluid circulating through the cooling coils. In some embodiments, other cooling fluids than water may be circulated through cooling coils in a modular cooling unit. For example, in some embodiments, a refrigerant may expand while circulating through cooling coils in a modular cooling unit as part of a mechanical refrigeration system. In some embodiments, cooling coils in a modular cooling unit may include a control valve to regulate a flow of cooling fluid through the cooling coils. In some embodiments, a controller of a modular cooling unit, such as controller 426, may command a control valve in cooling coils of a modular cooling unit to regulate the flow of cooling fluid through the cooling coils.

For example, modular cooling unit 402 includes cooling coils 404. Cooling coils 404 include inlet connector 406 and outlet connector 408, coils 416 and control valve 414. Cooling fluid, such as chilled water, is received from a data center support system via inlet connector 406 coupled to the data center support system. The cooling fluid circulates through coils 416 and absorbs thermal energy from air entering into modular cooling unit 402 via recycled air inlet 412 and passing over coils 416. Control valve 414 opens and closes according to a received control signal to increase or decrease a flowrate of cooling fluid through coils 416. After passing through coils 416, the cooling fluid is returned via outlet connector 408 to another data center support system. For example, a data center may include a chilled water supply header and chilled water return header. Chilled water may be supplied to a modular cooling unit from the chilled water supply header and returned from the modular cooling unit to the chilled water return header. Inlet connector 406 and outlet connector 408 may be flexible hoses that are configured to couple with pre-installed data center support systems. In some embodiments, a modular cooling unit with cooling coils may include a drain valve to drain the cooling coils. For example, coils 416 include drain valve 418. A modular cooling unit with cooling coils may function in the same manner and include the same components as modular cooling units described in FIGS. 1-3.

In some embodiments, a modular cooling unit that includes cooling coils may not include a control valve, such as control valve 414. In such embodiments, a flow of cooling fluid through cooling coils 416 may be controlled by supply and return pressures in data center support system headers that are connected to inlet connector 406 and outlet connector 408.

In some embodiments, a modular cooling unit that includes cooling coils may operate in an economizer mode. In an economizer mode, a controller may be configured to control an air flow control device at a fresh air inlet of a modular cooling unit to mix ambient air with recycled air from within the data center when ambient conditions outside of the data center are such that mixing the outside ambient air with the recycled air from within the data center reduce a heat load on the cooling system. For example, outside ambient air may be cooler than recycled air such that mixing outside ambient air may reduce an amount of energy required to be removed by chilled water circulating through cooling coils of a modular cooling unit.

In some embodiments, a modular cooling unit may include access panels that allow access to air moving devices. For example, modular cooling unit 402 includes access panels 420. Any of the modular cooling units described in FIGS. 1-9 may include access panels.

A modular cooling unit may be configured to be installed in a data center through an opening in an exterior wall of a data center as a single unit and translate into position in a data center along rails structures mounted above racks in the data center.

Figure 5:
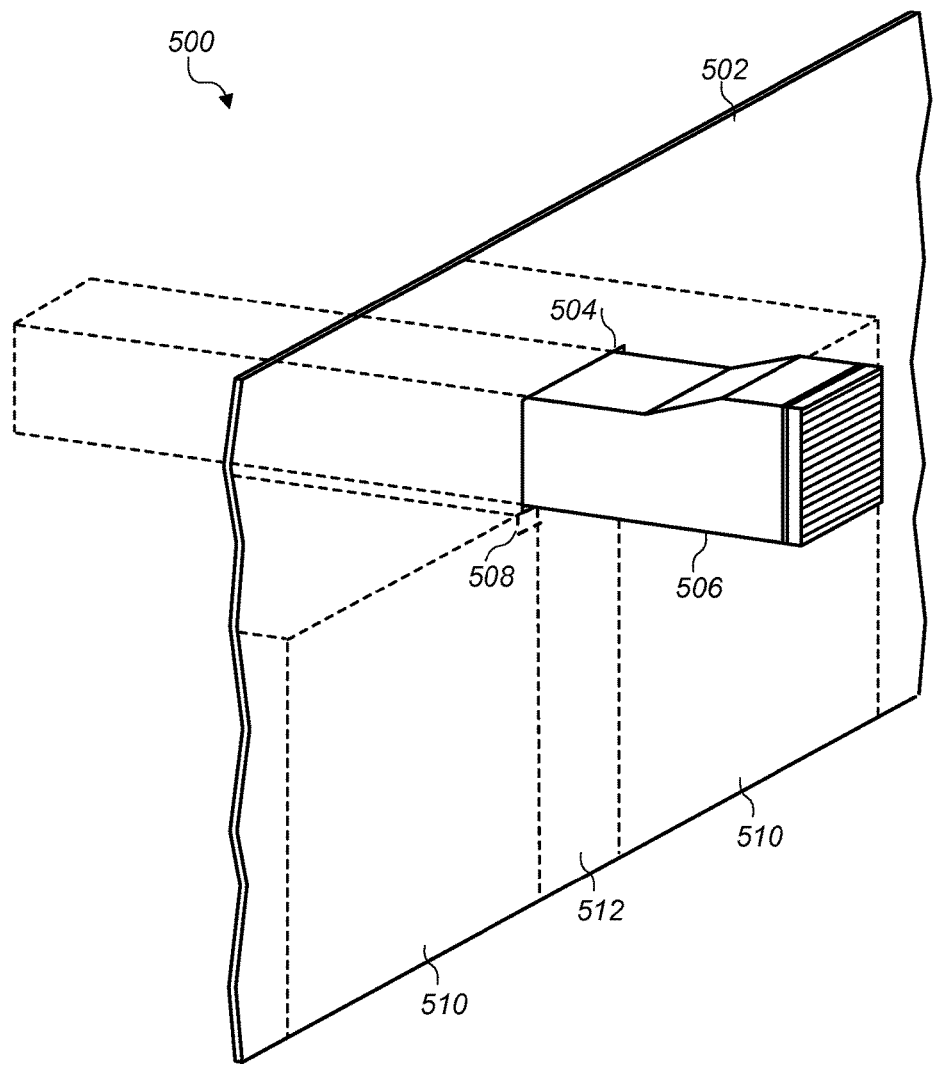
FIG. 5 illustrates a modular cooling unit being installed through an opening in a wall of a data center, according to some embodiments.

FIG. 5 illustrates a modular cooling unit being installed through an opening in a wall of a data center, according to some embodiments.

Data center 500 includes exterior wall 502 with opening 504. Modular cooling unit 506 is configured to translate into position in data center 500 by sliding along rail structure 508 mounted above rows of rack computing systems 510. Rail structure 508 are mounted on either side of cold aisle 512 above rack computing systems 510. In some embodiments, a modular cooling unit may be received at a data center location having already been configured for installation and tested prior to being received at the data center location. For example, a modular cooling unit may be configured with cooling coils or an evaporative cooler prior to being received at a data center location. The already configured and tested modular cooling unit may be installed through an opening in a wall at a data center location without additional configurations of the modular cooling unit being required after the modular cooling unit is received at the data center location.

In some embodiments, a data center may not include walls. For example, data center 500 may include a roof but not include wall 502. In some embodiments, a data center may be formed by two rows of rack computer systems and a modular cooling unit that at least partially seals a cold aisle between the two rows of rack computing systems without walls or a roof. For example, a data center may comprise modular cooling unit 506 mounted above rows of rack computing systems 510 without wall 502 or a roof.

Figure 6:
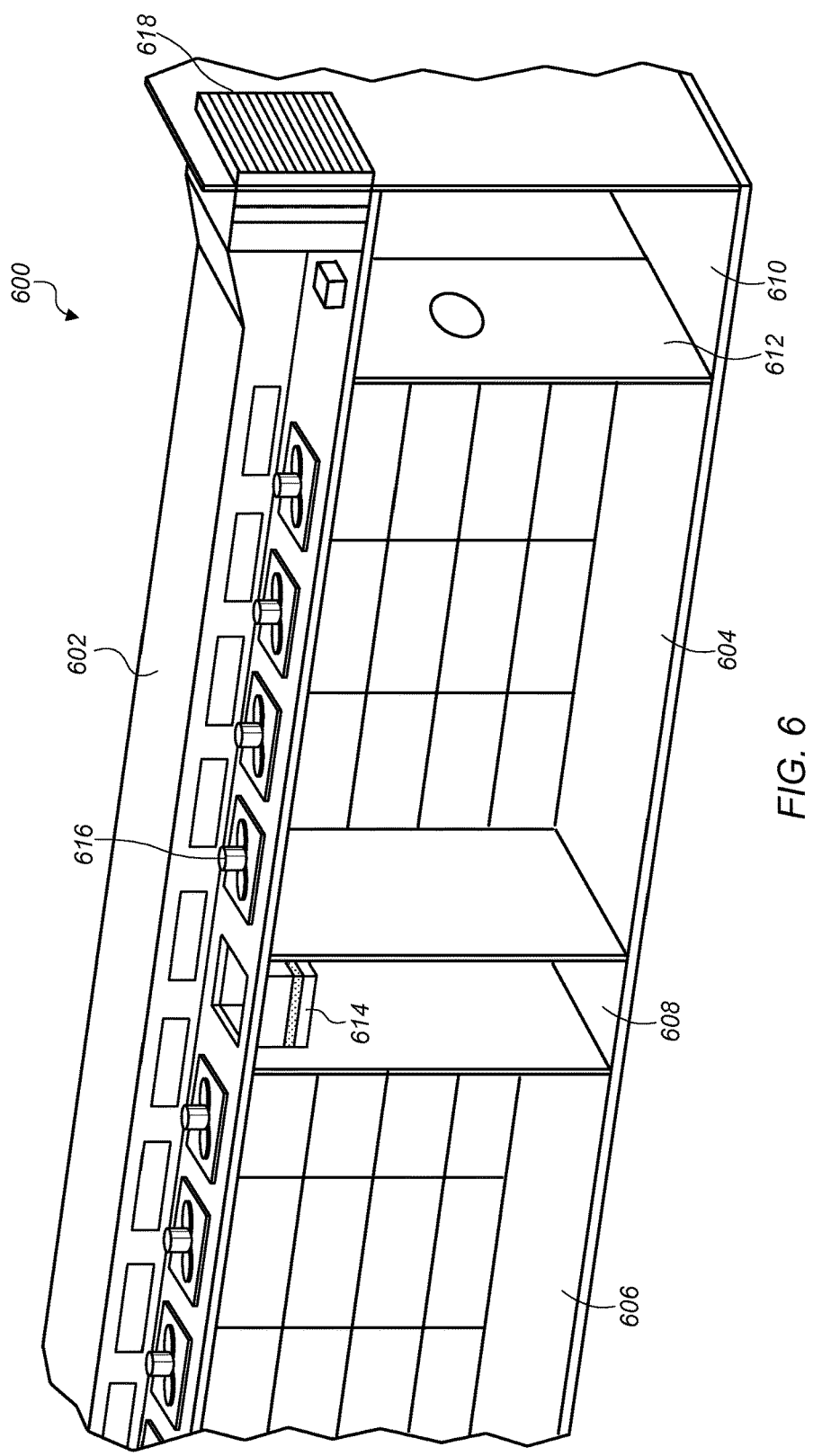
FIG. 6 illustrates a modular cooling unit that spans multiple cold aisles, according to some embodiments.

In some embodiments a modular cooling unit may span more than one cold aisle. For example, FIG. 6 illustrates a modular cooling unit that spans multiple cold aisles, according to some embodiments. Modular cooling unit 602 in data center 600 spans cold aisle 604 and cold aisle 606 and passes over hot aisle 608. As illustrated in FIG. 6, in some embodiments a cold aisle below a modular cooling unit may include a door that at least partially seals the modular cooling unit from an access corridor for accessing multiple cold aisles. For example, cold aisle 604 is separated from corridor 610 by door 612. Any of the modular cooling units described in FIGS. 1-9 may be modified to span multiple cold aisle as shown in FIG. 6. Modular cooling unit 602 includes a recycled air inlet 614. Air moving devices 616 of modular cooling unit 602 may draw air into modular cooling unit 602 via recycled air inlet 614 and fresh air inlet 618. Modular cooling unit 602 may be controlled in a similar manner as any of the modular cooling units described in FIGS. 1-9. In some embodiments, a modular cooling unit that spans multiple cold aisles may include an evaporative cooler, cooling coils, or both. A modular cooling unit that spans multiple cold aisles may be installed in a data center in similar manner as any of the modular cooling units described in FIGS. 1-9 and may include flexible connectors configured to couple with data center support system connectors as described in FIGS. 1-9.

Figure 7:
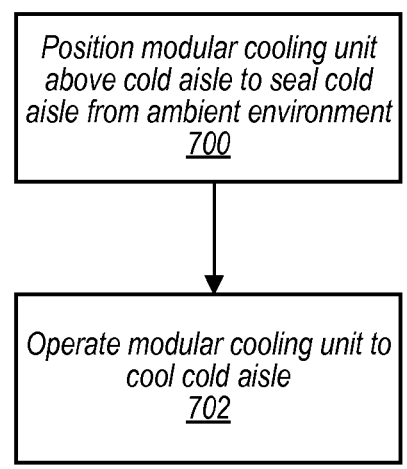
FIG. 7 illustrates expanding cooling capacity in a data center, according to some embodiments.

FIG. 7 illustrates expanding cooling capacity in a data center, according to some embodiments. Modular cooling units may be added to a data center to incrementally increase HVAC capacity of the data center. In some embodiments, modular cooling units may be added to an existing data center that is in operation to provide additional cooling capacity as additional rack computing systems are added to the data center. In some embodiments, modular cooling units may be used in a partially filled data center to provide cooling to cold aisles in the data center while not expending resources and energy to cool portions of the data center that are not being used for data center operations such as areas that are not filled with rack computing systems.

At 700 a modular cooling unit is positioned in a data center above a cold aisle in the data center. The modular cooling unit may be translated along a rail structure mounted in the data center above rack mounted computing systems in the data center that are arranged in rows and that form a cold aisle between successive rows. The modular cooling unit may partially seal the cold aisle from a hot ambient environment in the data center. One or more additional partitions such as a back wall and a door along with the rack computing systems may also partially enclose the cold aisle. In some embodiments, rack computing system may expel heated air that has been used to remove waste heat from heat producing components in the rack computing system into the ambient environment of the data center that is not enclosed within the cold aisle. In such embodiments, the interior space of the data center not included in cold aisles may be considered a large hot aisle. A modular cooling unit may seal a cold aisle from the hot ambient environment in the data center.

At 702 the modular cooling unit is operated to cool the cold aisle. Any of the data centers described in FIGS. 1-9 may have their cooling capacities increased as described in FIG. 7.

Figure 8:
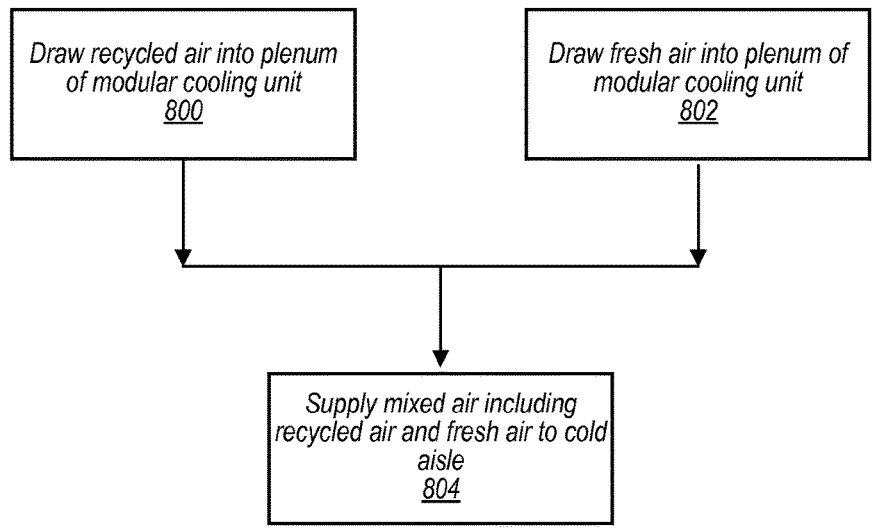
FIG. 8 illustrates operating a modular cooling unit in a data center, according to some embodiments.

FIG. 8 illustrates operating a modular cooling unit in a data center, according to some embodiments.

In some embodiments, one or more air moving devices within a modular cooling unit may draw air into the modular cooling unit from a hot ambient environment within a data center, this air from the ambient environment within the data center may be considered recycled air. One or more air moving devices in a modular cooling unit may also draw air into the modular cooling unit from an outside environment that is external to the data center, such as the outdoors. This outdoor air may be considered fresh air. Recycled air and fresh air may mix in an air plenum of the modular cooling unit and the one or more air moving devices of the modular cooling unit may direct mixed air into the cold aisle. In some embodiments, fresh air may pass through an evaporative cooler to cool the fresh air as it is drawn into the plenum of the modular cooling unit. In some embodiments, cooling coils may cool recycled air as it is drawn into the plenum of the modular cooling unit. In some embodiments, a controller may control air moving devices to adjust a quantity of air that is drawn into the plenum from a recycled air inlet and from a fresh air inlet. Also, one or more flow control devices may adjust a distribution of air that is drawn into a plenum of a modular cooling unit from a recycled air inlet and a fresh air inlet. For example, flow control devices in one control situation may cause 80% recycled air and 20% fresh air to be drawn into a plenum of a modular cooling unit and in another control situation cause 70% fresh air and 30% recycled air to be drawn into a plenum of a modular cooling unit. In embodiments, that include an evaporative cooler, by adjusting a distribution of air that is drawn into a plenum of a modular cooling unit from a fresh air inlet, a controller may adjust a distribution of air that is cooled by the evaporative cooler. Likewise, in embodiments that include cooling coils located near a recycled air inlet of a modular cooling unit, by adjusting an amount of recycled air that is drawn into a plenum of a modular cooling unit, a controller may adjust a distribution of air supplied to a cold aisle that is cooled by the cooling coils. In some embodiments, a controller may also control a flow rate of cooling fluid that flows through cooling coils to adjust an amount of cooling that is performed on air that is drawn into a plenum of a modular cooling unit from a recycled air inlet. In some embodiments, a modular cooling unit may include both an evaporative cooler and cooling coils.

At 800 air is drawn into a plenum of a modular cooling unit from a recycled air inlet that is in fluid communication with an ambient environment within a data center. At the same time, at 802 air is drawn into the plenum of the modular cooling unit from an external environment, such as the outdoors, via a fresh air inlet. As discussed above a controller may control one or more flow control devices, air movers, etc. to adjust amounts of air and distributions of air that are drawn into a plenum from a recycled air inlet and from a fresh air inlet. In some embodiments, no air may be drawn into a plenum from a recycled air inlet while air is drawn into the plenum via the fresh air inlet. In some embodiments, no air may be drawn into the plenum from a fresh air inlet while air is drawn into the plenum from a recycled air inlet.

At 804 mixed air from the plenum of the modular cooling unit is supplied to a cold aisle associated with the modular cooling unit. Air moving devices coupled to a plenum of a modular cooling unit may direct the mixed air from the plenum of the modular cooling unit into the cold aisle. The air moving device may also cause a low pressure in the plenum relative to an ambient pressure in the data center and an ambient pressure in an environment external to the data center. Differences in pressure between a low pressure in the plenum and the ambient pressure in the data center and the ambient pressure in the external environment external to the data center may cause air to be drawn into the plenum of the modular cooling unit from the ambient environment in the data center and from the external environment external to the data center. The recycled air from the ambient environment within the data center and the fresh air from the environment external to the data center may mix together in the plenum of the modular cooling unit and be directed into the cold aisle by the air moving devices coupled to the body of the modular cooling unit. Any of the modular cooling units described in FIGS. 1-9 may be operated as described in FIG. 8.

Figure 9:
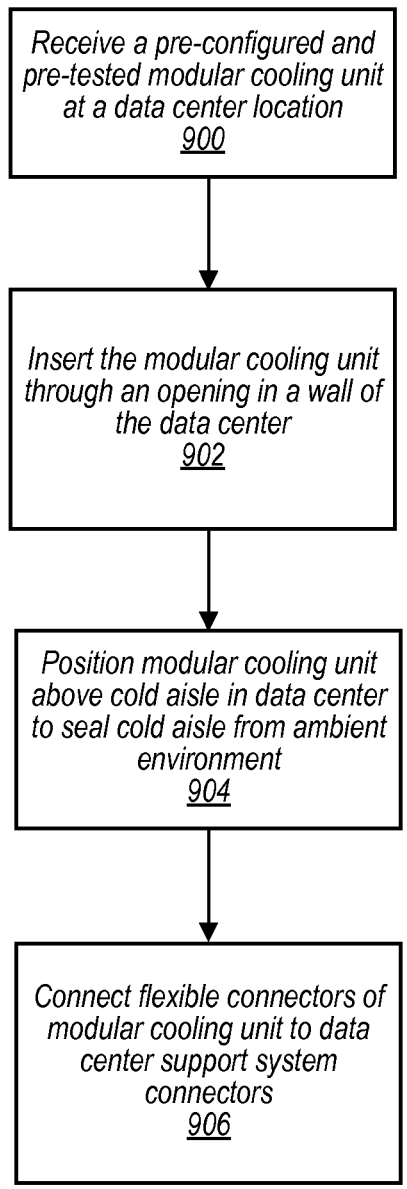
FIG. 9 illustrates installing a modular cooling unit in a data center, according to some embodiments.

FIG. 9 illustrates installing a modular cooling unit in a data center, according to some embodiments. At 900 a pre-configured and pre-tested modular cooling unit is received at a data center location. A pre-configured modular cooling unit may include an evaporative cooler, cooling coils or both. A pre-configured modular cooling unit may also include flexible connectors that are configured to couple with data center support system connectors. For example, a pre-configured modular cooling unit may include a power cord and a network connection cable. A pre-configured modular cooling unit may also include an evaporative cooler and a water inlet hose and connector configured to couple to a pre-installed water supply line within a data center. A pre-configured modular cooing unit may include cooling coils and may include flexible hoses with connectors configured to couple with a chilled water inlet connector and chilled water outlet connector of a data center. In some embodiments, a data center may include pre-installed chilled water supply and return headers and chilled water inlet connections and chilled water outlet connections configured to connect with flexible hoses and connectors of a pre-configured modular cooling unit.

In some embodiments, a pre-tested modular cooling unit may have been leak tested to ensure an evaporative cooler and/or cooling coils in the modular cooling unit do not leak. A pre-tested modular cooling unit may also have been tested to ensure all air moving devices in the modular cooling unit are functional. In some embodiments, a pre-tested modular cooling unit may include a controller that is pre-programmed for a particular installation in which the modular cooling unit is to be installed.

At 902, the modular cooling unit is inserted through an exterior wall of a data center. A data center may include removable panels on an exterior of the data center. The removable panels may be removed to provide access to an opening in the exterior wall of the data center. A modular cooling unit may be inserted into an opening accessed by removing a moveable panel to expand a cooling capacity of the data center.

At 904 a modular cooling unit is positioned in a data center above a cold aisle in the data center to seal the cold aisle from an ambient environment in the data center. In some embodiments, the modular cooling unit may form a ceiling for the cold aisle. In some embodiments, rail structures may be mounted above or on racks on either side of the cold aisle and a modular cooling unit may translate along the rail structures while being inserted through the external wall of the data center until the modular cooling unit is positioned above the cold aisle and seals the top portion of the cold aisle from the ambient environment in the data center. In some embodiments, a modular cooling unit positioned above a cold aisle to at least partially seal the cold aisle from one or more external environments may include a fresh air inlet that protrudes through the exterior wall of the data center into an external environment external to the data center when the modular cooling unit is positioned in the data center.

At 906, one or more flexible connectors of a modular cooling unit are connected to one or more data center support system connectors. Flexible connectors of a modular cooling unit may include an evaporative cooler water inlet hose, chilled water inlet and outlet hoses, power cords or power lines, network cables, etc. In some embodiments a data center may include pre-installed data center support systems and data center support system connectors that are installed in a data center prior to installing a particular modular cooling unit in the data center. Any of the modular cooling units described in FIGS. 1-8 may be installed in a data center as illustrated in FIG. 9.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising: a plurality of walls, wherein at least one of the walls comprises a plurality of openings configured to accept installation of modular cooling units; a plurality of rack computing systems each comprising a rack and a plurality of computing devices mounted in the rack, wherein the plurality of rack computing systems are arranged in rows with one or more cold aisles between successive rows of the rack computing systems; respective sets of rail structures mounted on the racks of the rack computing systems; and a plurality of modular cooling units, wherein each modular cooling unit comprises: a body with a length that spans multiple racks of one of the cold aisles, wherein the body is configured to translate along one of the sets of rail structures as the modular cooling unit is positioned into a position above the one of the cold aisles through one of the openings in the at least one wall of the data center; one or more air inlets; a plenum formed by the body of the modular cooling unit; one or more outlet vents in a bottom surface of the plenum; and a set of one or more air moving devices; wherein each of the plurality of modular cooling units is configured to be installed in the data center by translating on one of the sets of rail structures, as a unit, through one of the opening in the at least one wall of the data center; wherein individual ones of the plurality of modular cooling units are mounted on individual sets of the respective sets of rail structures and span respective lengths of respective ones of the cold aisles such that the respective bottom surfaces of the respective ones of the modular cooling units form respective ceilings for the respective cold aisles, wherein the individual ones of the modular cooling units at least partially seal the respective cold aisles from one or more other environments, wherein each respective set of one or more air moving devices of the respective ones of the modular cooling units is configured to draw air into the respective plenum of the respective modular cooling unit via the one or more air inlets of the respective modular cooling unit from the one or more other environments and is configured to direct air from the respective plenum through the respective one or more outlet vents of the respective modular cooling unit into the respective cold aisle.

2. The data center of claim 1, wherein for at least one modular cooling unit of the plurality of modular cooling units the one or more air inlets include a fresh air inlet and a recycled air inlet, wherein the at least one modular cooling unit further comprises:
   one or more flow control devices configured to adjust a flow of air through the fresh air inlet;
   one or more other flow control devices configured to adjust another flow of air through the recycled air inlet; and
   a controller configured to control the one or more flow control devices and the one or more other flow control devices to adjust the flow of air through the fresh air inlet and to adjust the other flow of air through the recycled air inlet such that the air in the plenum of the at least one modular cooling unit meets one or more control conditions.

3. The data center of claim 2, wherein the at least one modular cooling unit further comprises:
   an evaporative cooler, wherein the evaporative cooler is configured to cool air in the flow of air through the fresh air inlet,
   wherein the controller is further configured to adjust a mixture of air in the plenum of the at least one modular cooling unit resulting from combining the flow of air through the fresh air inlet cooled by the evaporative cooler and the other flow of air through the recycled air inlet.

4. The data center of claim 2, wherein the at least one modular cooling unit further comprises:
   one or more cooling coils, wherein a cooling fluid circulates through the one or more cooling coils and wherein the one or more cooling coils are configured to cool air in the other flow of air through the recycled air inlet,
   wherein the controller is further configured to adjust a mixture of air in the plenum of the at least one modular cooling unit resulting from combining the flow of air through the fresh air inlet and the other flow of air through the recycled air inlet cooled by the one or more cooling coils.

5. The data center of claim 2, wherein the data center further comprises:
   a building management system configured to coordinate respective controllers of respective ones of the plurality of modular cooling units.

6. An apparatus, comprising: a body with a length that spans multiple racks of a plurality of racks arranged to form a cold aisle, wherein the body is configured to translate along a set of rail structures mounted on the racks into a position above the cold aisle through an opening in a wall of a data center; a plenum formed by the body of the apparatus; one or more air inlets, wherein the one or more air inlets comprise a fresh air inlet configured to couple with the opening of the wall through which the body translates into the position above the cold aisle; and one or more air moving devices; wherein the apparatus is configured to be translated along the set of rail structures into the position above the cold aisle such that the apparatus spans a length of the cold aisle and at least partially seals the cold aisle from one or more other environments, wherein the one or more air moving devices are configured to draw air into the plenum via the one or more air inlets from the one or more other environments and direct air from the plenum through one or more outlet vents in the plenum into the cold aisle.

7. The apparatus of claim 6, wherein the one or more air inlets comprise a fresh air inlet and a recycled air inlet, and wherein the one or more other environments comprise an outside environment external to a data center and a non-cold aisle environment within the data center;
wherein the one or more air moving devices are configured to:
draw fresh air into the plenum through the fresh air inlet from the outside environment exterior to the data center; and
draw recycled air into the plenum through the recycled air inlet from the non-cold aisle environment within the data center.

8. The apparatus of claim 7, further comprising:
one or more flow control devices configured to adjust a flow of air through the fresh air inlet;
one or more other flow control devices configured to adjust another flow of air through the recycled air inlet; and
a controller configured to control the one or more flow control devices and the one or more other flow control devices to adjust the flow of air through the fresh air inlet and to adjust the other flow of air through the recycled air inlet such that a mixture of air in the plenum meets one or more control conditions.

9. The apparatus of claim 8, further comprising:
an evaporative cooler, wherein the evaporative cooler is configured to cool air in the flow of air through the fresh air inlet,
wherein the controller is further configured to adjust the mixture of the air in the plenum resulting from combining the air in the flow of air through the fresh air inlet cooled by the evaporative cooler and the other flow of air through the recycled air inlet to meet the one or more control conditions.

10. The apparatus of claim 8, further comprising:
one or more cooling coils configured to cool air in the other flow of air through the recycled air inlet,
wherein the controller is further configured to adjust the mixture of the air in the plenum resulting from combining the air in the flow of air through the fresh air inlet and the other flow of air through the recycled air inlet cooled by the one or more cooling coils to meet the one or more control conditions.

11. The apparatus of claim 8, wherein the controller is configured to control thermal conditions of the mixture of air in the plenum independent of other controllers in a data center.

12. The apparatus of claim 6, further comprising one or more flexible connectors configured to connect the apparatus to one or more pre-installed data center support system connectors.

13. A method, comprising:
inserting a modular cooling unit through an opening in a wall of a data center;
translating the modular cooling unit into a position above a cold aisle of the data center, wherein a plurality of rack computing systems of the data center are arranged in two successive rows with the cold aisle between the two successive rows, wherein the modular cooling unit is translated into a position such that a bottom surface of the modular cooling unit has a length that spans multiple ones of the rack computing systems along a length of the cold aisle and at least partially seals the cold aisle from one or more other environments; and
operating the modular cooling unit to cool the cold aisle.

14. The method of claim 13, wherein operating the modular cooling unit to cool the cold aisle comprises:
drawing air into a plenum of the modular cooling unit from within the data center via a recycled air inlet of the modular cooling unit;
drawing air into the plenum of the modular cooling unit from an ambient environment external to the data center via a fresh air inlet of the modular cooling unit; and
supplying mixed air to the cold aisle via a plurality of vents along the plenum of the modular cooling unit between the fresh air inlet and the recycled air inlet, wherein the mixed air comprises the air from within the data center and the air from the ambient environment external to the data center.

15. The method of claim 14, wherein said operating the modular cooling unit further comprises:
adjusting one or more control devices to control a temperature of the mixed air, wherein at least one of the one or more control devices are configured to regulate a flow of air into the plenum from within the data center or configured to regulate another flow of air into the plenum from the ambient environment external to the data center.

16. The method of claim 13, further comprising:
receiving the modular cooling unit at the data center, wherein prior to said receiving the modular cooling unit, the modular cooling has been pre-configured and tested for installation at the data center.

17. The method of claim 13, further comprising:
prior to said operating the modular cooling unit to cool the cold aisle, connecting one or more flexible connectors of the modular cooling unit to one or more data center support system connectors, wherein the data center support system connectors are installed in the data center prior to said positioning the modular cooling unit above the plurality of rack computing systems in the data center.

* * * * *